United States Patent [19]

Carter et al.

[11] Patent Number: 4,570,239
[45] Date of Patent: Feb. 11, 1986

[54] SERIES READ-ONLY-MEMORY HAVING CAPACITIVE BOOTSTRAP PRECHARGING CIRCUITRY

[75] Inventors: Ernest A. Carter; John K. Eitrheim; Dorothy M. Wood, all of Austin, Tex.

[73] Assignee: Motorola, Inc., Schaumburg, Ill.

[21] Appl. No.: 460,335

[22] Filed: Jan. 24, 1983

[51] Int. Cl.[4] .................. G11C 11/40; G11C 17/00
[52] U.S. Cl. ................................ 365/203; 365/104
[58] Field of Search .......... 365/203, 104, 103, 94; 307/482

[56] References Cited

U.S. PATENT DOCUMENTS

| | | | |
|---|---|---|---|
| 3,611,437 | 10/1971 | Varadi | 365/203 |
| 4,142,176 | 2/1979 | Dozier | 357/41 |
| 4,183,093 | 1/1980 | Kawagoe | 365/104 |
| 4,318,014 | 3/1982 | McAlister et al. | 365/203 |
| 4,404,654 | 9/1983 | Kamuro et al. | 365/103 |
| 4,485,460 | 11/1984 | Stambaugh | 365/203 |

FOREIGN PATENT DOCUMENTS 0157196 12/1980 Japan.

OTHER PUBLICATIONS

Kawagoe, "Minimum Size ROM Structure Compatible with Silicon Gate E/D MOS LSI", IEEE Journal of Solid State Circuits, vol. SC-11, No. 3, Jun. 1976, pp. 360-364.

Lin, "A 4 μm NMOS NAND Structure PLA", IEEE Journal of Solid State Circuits, vol. SC-16, No. 2, Apr. 1981, pp. 103-107.

Primary Examiner—Stuart N. Hecker
Assistant Examiner—Glenn A. Gossage
Attorney, Agent, or Firm—Anthony J. Sarli, Jr.; Jeffrey Van Myers

[57] ABSTRACT

A read-only-memory (ROM) having a plurality of enhancement and depletion transistors selectively arranged in an array with the gates of the transistors in each row connected in common to form word lines, and the current paths of the transistors in each column connected in series to form bit lines. The word lines are precharged and then allowed to float. The bit lines are then precharged, bootstrapping the word lines above the precharge level. A selected one of the word lines is thereafter discharged before one end of each of the bit lines is connected to ground. A selected bit line will either remain precharged or be discharged depending upon the type of transistor at the intersection of the selected word and bit lines.

10 Claims, 2 Drawing Figures

SERIES READ-ONLY-MEMORY HAVING CAPACITIVE BOOTSTRAP PRECHARGING CIRCUITRY

BACKGROUND OF THE INVENTION

1. Field of the Invention

The present invention relates generally to read-only-memories, and, more particularly, to a series read-only-memory which has capacitive bootstrap precharging circuitry.

2. Background Art

In general, read-only-memories (ROM's) are implemented in either NOR/OR logic or NAND/AND logic. In ROM's of the NOR/OR type, the logic states of individual data bits are typically represented by the presence or absence of transistors at selected locations within an array of transistor sites. Upon the selection of one of the word lines, each of the transistors which are present in the corresponding row of the array will be enabled. Since the transistors which are present in each column of the array are connected in parallel to a respective bit line, the enabling of any one of the transistors in a column via one of the word lines will discharge the precharged bit line. Thus, the logic state of the bit "stored" at the junction of the selected word line and a particular one of the bit lines will be reflected by the state of that bit line after the selection of that word line. A typical ROM of the NOR/OR type is shown and described in U.S. Pat. No. 4,350,992.

In ROM's of the NAND/AND type, the logic states of data bits are typically represented by the type of transistor, e.g. enhancement or depletion, which is fabricated at the respective transistor sites. Upon the selection of one of the word lines, every enhancement transistor present in the corresponding row of the array will be disabled, while the depletion transistors, if any, in the row will remain enabled. Since the transistors which are present in each column of the array are connected in series to form a respective bit line, the disabling of any one of the enhancement transistors in a column via one of the word lines will prevent the discharge of the precharged bit line. Thus, the logic state of the bit represented by the transistor at the junction of the selected word line and the particular bit line will be reflected by the state of that bit line after the selection of that word line. An early ROM of the NAND/AND type is described in U.S. Pat. No. 4,059,826.

In general, ROM's of the NAND/AND type are considerably smaller than the comparably sized NOR/OR type because the series-connected transistors can be fabricated without interlayer contacts and without a distributed discharge line. However, the cumulative resistances of the series-connected transistors impede the discharge of the bit lines. Thus, ROM's of the NOR/OR type are typically faster than those of the NAND/AND type because the bit lines can be very rapidly discharged by any one of the parallel-connected transistors.

One ROM of the series type which provided a respectable cycle time is described in "Minimum Size ROM Structure Compatible with Silicon-Gate E/D MOS LSI" on pages 360-364 of the June 1976 issue of *IEEE Journal of Solid-State Circuits*, Vol. SC-11, No. 3. In this ROM, forty-eight (48) transistors were connected in series to form the bit lines. However, the power supply voltages were quite high, on the order of about 12-18 volts, so that the on-resistances of the series-connected transistors were relatively low. In addition, the relatively large output capacitance of each of the bit lines, once precharged, provided significant charge which could be distributed among the inter-transistor nodes during address resolution without affecting the output state.

In contrast, the series ROM described in U.S. Pat. No. 4,142,176 is designed to be operated from a single 5 volt power supply. However, the number of transistors which could be connected in series to form a word line was very limited, being on the order of seven (7), due to the cumulative voltage drops of the series-connected transistors. Adding additional transistors in series would significantly increase the time to pull the bit line sufficiently close to ground to affect the output state. To compensate for the limited column size, a group selection technique was proposed.

SUMMARY OF THE INVENTION

Accordingly, it is an object of the present invention to provide a read-only-memory of the series type wherein a relatively large number of transistors may be connected in series and operated using a single, relatively low voltage power supply.

Another object of the present invention is to provide a read-only-memory of the series type having a relatively fast access cycle when operated on a single, relatively low voltage power supply.

Yet another object of the present invention is to provide a read-only-memory of the series type having a relatively large number of series-transistors and a relatively fast access cycle.

Still another object of the present invention is to provide a read-only-memory of the series type having capacitive bootstrap precharging circuitry.

These and other objects of the present invention are achieved in a read-only-memory comprising: a plurality of insulated gate field effect transistors of two predetermined types selectively arranged in an array with the gate of each of the transistors in each of the rows of the array connected in common to form respective word lines, and with the current paths of each of the transistors in each of the columns of the array being connected in series between first and second ends of each column to form respective bit lines. In the present invention, a word line precharge circuit is provided to couple a first predetermined voltage to each of the word lines during a word line precharge interval, and to thereafter uncouple the first voltage from the word lines; and a bit line precharge circuit is provided to couple the first voltage to one end of each of the bit lines during a bit line precharge interval following the end of the word line precharge interval, and to thereafter couple a second predetermined voltage to the first end of each of the bit lines. A word line address decoder circuit couples the second voltage to the one of the word lines selected by an address signal after the end of the word line precharge interval but before the end of the bit line precharge interval so that the second ends of the bit lines will be selectively discharged. In the preferred form, a bit line address decoder circuit couples the first voltage to an output node during an output node precharge period following the word line precharge interval, and thereafter coupling the output node to the second end of a selected one of the bit lines in response to the address signal.

DESCRIPTION OF THE PREFERRED EMBODIMENT

Figure 1:
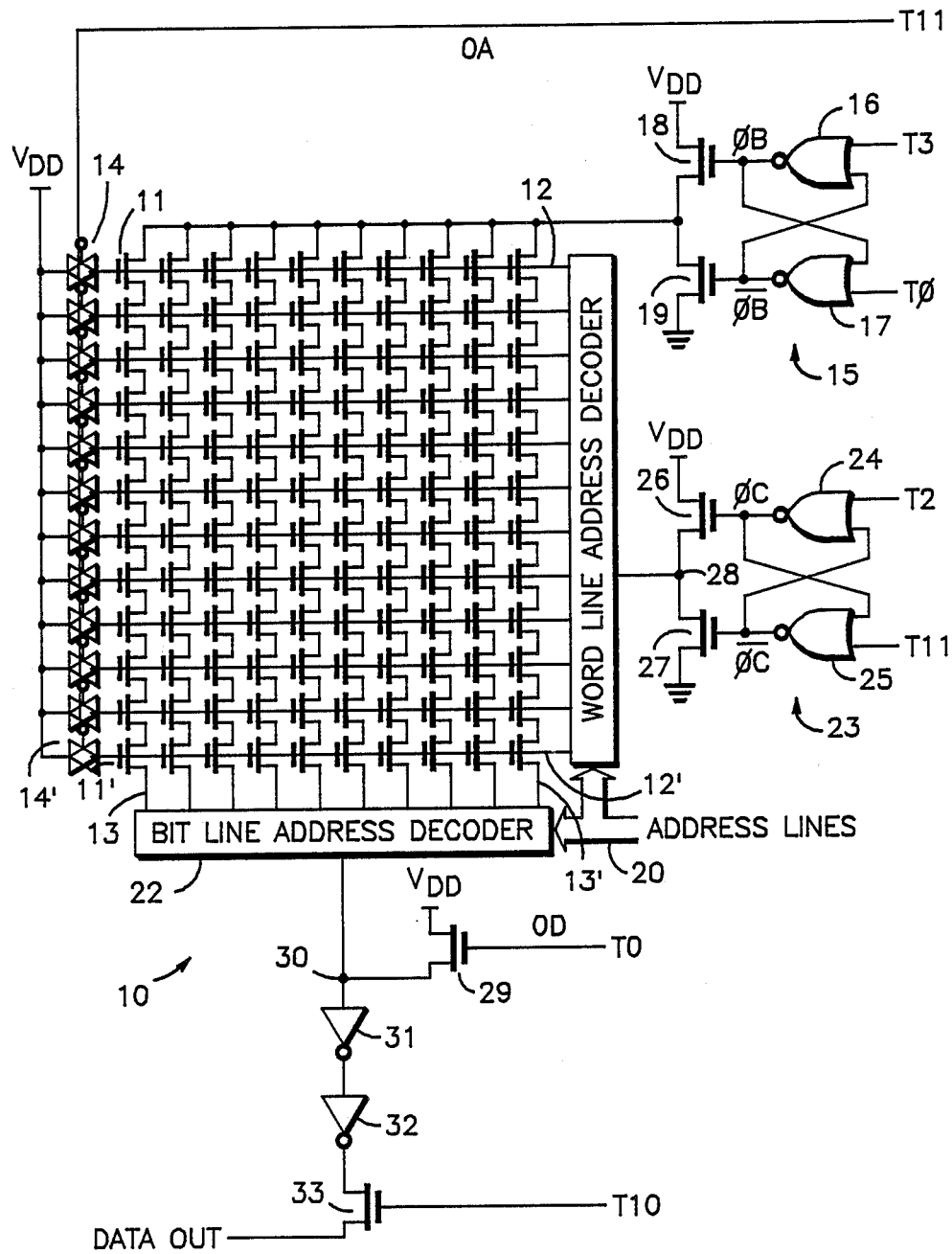
FIG. 1 is a schematic of a read-only-memory of the series type constructed in accordance with the present invention.

In the series read-only-memory (ROM) 10 shown in FIG. 1, a plurality of insulated gate field effect transistors 11 are arranged in an array with the gate of each of the transistors 11 in each of the rows of the array connected in common to form respective word lines 12, while the current paths of each of the transistors 11 in each of the columns of the array are connected in series to form respective bit lines 13. Each of the transistors 11 is either of the enhancement or depletion type, depending upon the state of the data bit represented thereby. For example, a "zero" might be represented by an enhancement transistor 11, while a "one" might be represented by a depletion transistor 11. The actual assignment of state is not really critical so long as the resulting output from the ROM 10 is properly interpreted.

Figure 2:
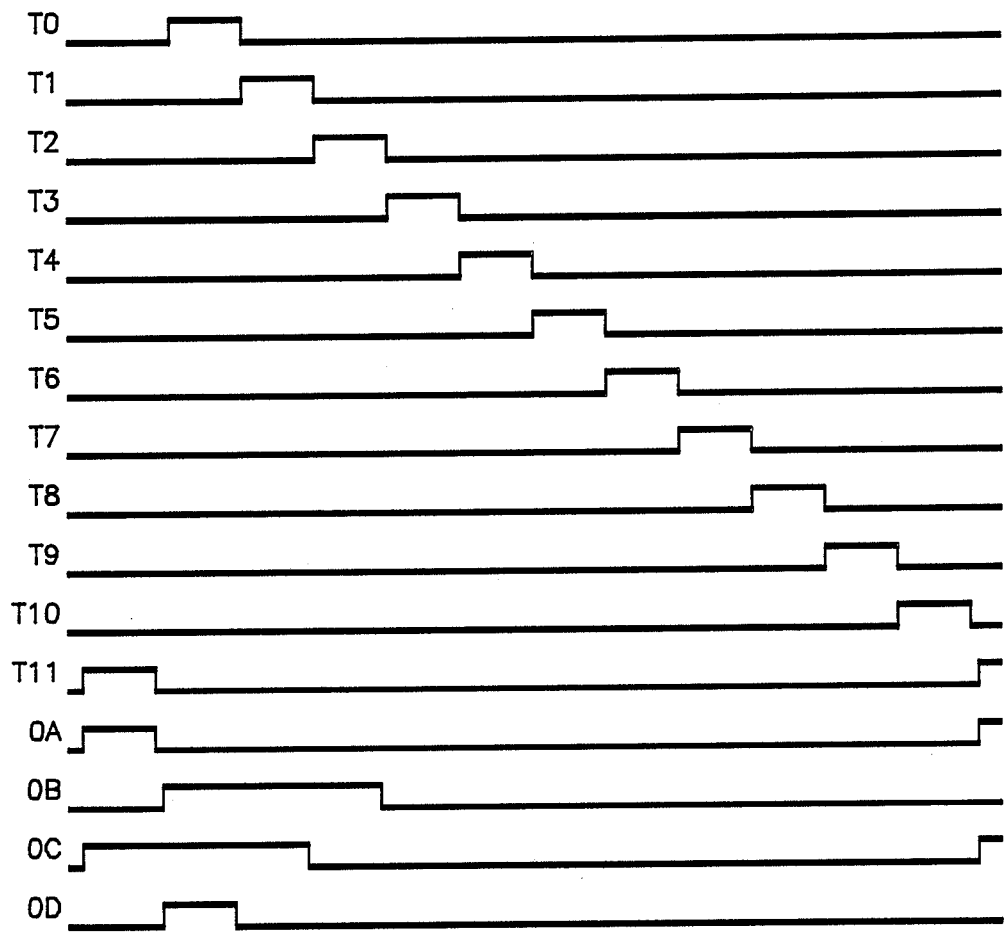
FIG. 2 is a timing diagram illustrating the operation of the read-only-memory of FIG. 1.

At the start of each access cycle, each of the word lines 12 in the ROM 10 is coupled via a respective one of a set of word line precharge transistors 14 to a supply voltage Vdd during a word line precharge interval ØA. Since the resistance of each word line 12 is small and the respective transistor 14 can be made as large as desired, the word line precharge interval ØA can be rather short. If, for example, the access cycle is divided into twelve (12) timeslots, T0–T11, as shown in FIG. 2, the start and end of the word line precharge interval ØA can be conveniently defined using the leading and trailing edges, respectively, of timeslot T11. At the end of the word line precharge interval ØA, transistors 14 uncouple the respective word lines from the supply voltage Vdd, leaving the word lines 12 precharged. Preferably, the transistors 14 are of the "natural" or zero-threshold type so as to maximize the precharging voltage of the word lines 12.

Each of the bit lines 13 is coupled via a coupler 15, comprising cross-coupled NOR gates 16 and 17 and push-pull connected transistors 18 and 19, to the supply voltage Vdd during a bit line precharge interval ØB following the end of the word line precharge interval ØA. Referring to FIG. 2, the start of the bit line precharge interval ØB can be defined using the leading edge of timeslot T0, while the end of the bit line precharge interval ØB can be defined using a later event selected to assure adequate precharging of the bit lines 13.

Since the precharged word lines 12 have been uncoupled from the supply voltage Vdd by transistors 14 before the start of the bit line precharge interval ØB, the voltage on the word lines 12 will be capacitively boosted above the precharge voltage as the bit lines 13 precharge. Due to this bootstrapping action, all of the enhancement type transistors 11 in the array will be turned on even harder, dynamically reducing the on-resistance of the bit lines 13. As the series resistance drops, the precharging (and bootstrapping) proceeds even more rapidly. Note that transistors 14, which are of the natural type, remain off even if the word lines 12 are boosted above the supply voltage Vdd. It has been determined that, as a result of the bootstrap enhanced precharging action, the end of the bit line precharge interval ØB can be defined using the leading edge of timeslot T3 as shown in FIG. 2. The resulting bit line precharge interval ØB is substantially shorter than would be possible if ROM 10 were constructed using the conventional precharge techniques used in prior art series-type ROM's.

In the preferred embodiment, an access address is applied via address lines 20 to conventional word line address decoder 21 and bit line address decoder 22 coincident with, or shortly after, the start of the bit line precharge interval ØB. To prevent premature discharge of any of the precharged word lines 12 while word line address decoder 21 is decoding the access address, a coupler 23, comprising cross-coupled NOR gates 24 and 25 and push-pull connected transistors 26 and 27, couples the common node 28 of word line address decoder 21 to supply voltage Vdd during a word line address decoder precharge interval ØC beginning before the end of the word line precharge interval ØA and ending only after the word line address decoder 21 has had sufficient time to stabilize. As shown in FIG. 2, the start of the word line address decoder precharge interval ØC can be conveniently defined using the leading edge of timeslot T11. This allows transistor 26 to assist in the precharging of the word lines 12, as well as to precharge the word line address decoder 21 itself.

To precharge the bit line address decoder 22, a transistor 29 will couple the output node of bit line address decoder 22 to the supply voltage Vdd during a bit line address decoder precharge interval ØD beginning after the end of the word line precharge interval ØA. As in the case of the word line precharge interval ØA, the bit line address decoder precharge interval ØD can be rather short, beginning, for example, with the leading edge of timeslot T0 and ending with the trailing edge of the same timeslot T0.

By the end of the bit line address decoder precharge interval, all of the word lines 12, all of the bit lines 13, the word line address decoder 21 and the bit line address decode 22 have been precharged. The word line address decoder 21 has also had sufficient time to couple the appropriate one of the word lines 12 to node 28. Accordingly, upon the occurrence of the next convenient event, namely the leading edge of timeslot T2, the word line address decoder precharge interval ØC can be terminated, as shown in FIG. 2. In response, transistor 27 couples node 28 to ground and quickly discharges just the selected word line 12 to ground. Thus, all of the enhancement transistors 11 in the corresponding row of the array will be turned off. Note, however, that all of the depletion transistors 11 in the same row will remain on, and that all other transistors 11 in the array, whether enhancement or depletion, also remain on.

After the selected word line 12 has had sufficient time to discharge, the bit line precharge interval ØB can be terminated. In the preferred embodiment, this occurs rather quickly, allowing the bit line precharge interval ØB to be terminated on the leading edge of timeslot T3, as shown in FIG. 2. In response, transistor 19 couples the common ends of the bit lines 13 to ground, providing a discharge path for each of the bit lines 13.

If a given bit line 13 has a depletion transistor 11 in the selected row, the end of that bit line 13 coupled to the bit line address decoder 22 will be discharged. If one of these bit lines 13 has been selected by bit line address decoder 22, then output node 30 will also be discharged.

On the other hand, each bit line 13 having an enhancement transistor 11 in the selected row will remain precharged on the end coupled to the bit line address decoder 22. If bit line address decoder 22 has selected one of these bit lines 13, then output node 30 will remain precharged. In either event, the state of output node 30, as reflected by series inverters 31 and 32, can be captured by coupler transistor 33 for ouput from ROM 10. Thus, the voltage of the data output by ROM 10 will be substantially ground if a depletion transistor 11 has been fabricated in the selected row and column of the array, and around the supply voltage Vdd if an enhancement transistor 11 has been fabricated at that position of the array. As noted before, the states that these voltages represent is a matter of choice.

Although the present invention has been described in the context of one preferred embodiment, various other embodiments will be readily evident to those skilled in the art. For example, the bit line address decoder 22 could be eliminated, thereby providing a plurality of parallel data outputs from the same size array. On the other hand, a plurality of arrays of transistors 11, each with an associated bit line address decoder 22, could be used with a single word line address decoder 21 to provide a plurality of parallel data outputs.

Using the present invention, a polysilicon gate, N-channel integrated circuit having forty-one (41) series-coupled transistors 11 has been successfully operated using a single 5-volt supply voltage Vdd to provide an access cycle of less than 4 microseconds. In this embodiment, no metal connections were required within the array, since the current paths of the transistors 11 were connected in series via the substrate and the gates were connected in parallel using polysilicon. It was thus possible to deposit a metal layer across the entire array. By connecting this layer to the supply voltage Vdd during the word line precharge interval ∅A the bootstrapping action on the word lines 12 was further enhanced.

In these and other embodiments, the present invention may be employed to provide maximum speed of access for a given supply voltage Vdd and bit line length. As will be clear to those skilled in the art, reducing the number of series-connected transistors 11, without changing the supply voltage Vdd, will significantly reduce the access cycle time. On the other hand, the access cycle time may be reduced without reducing the number of series-connected transistors 11 by using a higher supply voltage Vdd. Those skilled in the art will readily perceive other modifications and uses of the present invention. Accordingly, it is intended by the appended claims to cover all such modifications and forms of the disclosed embodiment which fall within the true spirit and scope of the present invention.

We claim:

1. A read-only-memory comprising:
   a plurality of insulated gate field effect transistors of two predetermined types selectively arranged in an array with the gate of each of the transistors in each of the rows of the array connected in common to form respective word lines, and with the current paths of each of the transistors in each of the respective columns of the array being connected in series between first and second ends of each column to form respective bit lines;
   word line precharge means for coupling a first predetermined voltage to each of the word lines during a word line precharge interval, and thereafter uncoupling the first voltage from the word lines;
   bit line precharge means for coupling the first voltage to a first end of each of the bit lines during a bit line precharge interval following the end of the word line precharge interval, and thereafter coupling a second predetermined voltage to the first end of each of the bit lines; and
   word line address decoder means for coupling the second voltage to the one of the word lines selected by an address signal after the start of the bit line precharge interval but before the end of the bit line precharge interval;
   whereby the second ends of the bit lines will be selectively discharged.

2. The memory of claim 1 further comprising:
   an output node; and
   bit line address decoder means for coupling the first voltage to the output node during an output node precharge interval following the word line precharge interval, and thereafter coupling the output node to the second end of a selected one of the bit lines in response to the address signal.

3. The memory of claim 2 wherein the two predetermined types of transistors comprise enhancement and depletion types.

4. The memory of claim 3 wherein the word line precharge means comprise a plurality of insulated gate field effect transistors, each coupling a respective one of the word lines to the first voltage during the word line precharge interval.

5. The memory of claim 4 wherein the transistors comprising the word line precharge means are of the natural type.

6. The memory of claim 1 wherein the two predetermined types of transistors comprise enhancement and depletion types.

7. The memory of claim 6 wherein the word line precharge means comprise a plurality of insulated gate field effect transistor, each coupling a respective one of the word lines to the first voltage during the word line precharge interval.

8. The memory of claim 7 wherein the transistors comprising the word line precharge means are of the natural type.

9. The memory of claim 1 wherein the word line precharge means comprise a plurality of insulated gate field effect transistors, each coupling a respective one of the word lines to the first voltage during the word line precharge interval.

10. The memory of claim 9 wherein the transistors comprising the word line precharge means are of the natural type.

* * * * *